(12) United States Patent
Lin et al.

(10) Patent No.: US 8,748,973 B2
(45) Date of Patent: Jun. 10, 2014

(54) SUPER JUNCTION TRANSISTOR AND FABRICATION METHOD THEREOF

(75) Inventors: Yung-Fa Lin, Hsinchu (TW); Shou-Yi Hsu, Hsinchu County (TW); Meng-Wei Wu, Hsinchu (TW); Main-Gwo Chen, Hsinchu County (TW); Chia-Hao Chang, Hsinchu (TW); Chia-Wei Chen, Taipei (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 268 days.

(21) Appl. No.: 13/433,302

(22) Filed: Mar. 29, 2012

(65) Prior Publication Data

US 2012/0292687 A1 Nov. 22, 2012

Related U.S. Application Data

(63) Continuation-in-part of application No. 13/234,132, filed on Sep. 15, 2011, now Pat. No. 8,541,278.

(30) Foreign Application Priority Data

May 19, 2011 (TW) .............................. 100117647 A
Oct. 24, 2011 (TW) .............................. 100138525 A

(51) Int. Cl.
*H01L 29/66* (2006.01)
*H01L 29/78* (2006.01)

(52) U.S. Cl.
CPC ................................ *H01L 29/7813* (2013.01);
*H01L 2924/13091* (2013.01)
USPC ........... 257/330; 257/329; 257/331; 257/288;
257/401; 438/212; 438/270; 438/197

(58) Field of Classification Search
CPC ............ H01L 29/7802; H01L 29/7813; H01L 2924/13091; H01L 29/781; H01L 29/66666; H01L 29/66272; H01L 29/6628; H01L 29/8083; H01L 29/808; H01L 29/7827; H01L 29/7831
USPC ......... 257/329, 330, 331, 332, 341, 288, 401, 257/335; 438/137, 192, 212, 259, 270, 271, 438/589, 587, 588, 197, 284, 286
See application file for complete search history.

(56) References Cited

U.S. PATENT DOCUMENTS

| 5,468,982 | A | 11/1995 | Hshieh | |
|---|---|---|---|---|
| 6,444,528 | B1 | 9/2002 | Murphy | |
| 6,534,836 | B1 * | 3/2003 | Osanai | ........................ 257/401 |
| 7,652,326 | B2 | 1/2010 | Kocon | |
| 2003/0194843 | A1 | 10/2003 | Thapar | |
| 2012/0289037 | A1 * | 11/2012 | Lin et al. | ........................ 438/561 |
| 2012/0306006 | A1 * | 12/2012 | Lin et al. | ........................ 257/330 |

* cited by examiner

*Primary Examiner* — Thanh Tran
(74) *Attorney, Agent, or Firm* — Winston Hsu; Scott Margo

(57) ABSTRACT

A super junction transistor includes a drain substrate, an epitaxial layer, wherein the epitaxial layer is disposed on the drain substrate, a plurality of gate structure units embedded on the surface of the epitaxial layer, a plurality of trenches disposed in the epitaxial layer between the drain substrate and the gate structure units, a buffer layer in direct contact with the inner surface of the trenches, a plurality of body diffusion regions with a first conductivity type adjacent to the outer surface of the trenches, wherein there is at least a PN junction on the interface between the body diffusion region and the epitaxial layer, and a doped source region, wherein the doped source region is disposed in the epitaxial layer and is adjacent to the gate structure unit.

18 Claims, 8 Drawing Sheets

US 8,748,973 B2

SUPER JUNCTION TRANSISTOR AND FABRICATION METHOD THEREOF

CROSS REFERENCE TO RELATED APPLICATIONS

This application is a continuation-in-part of U.S. application Ser. No. 13/234,132, filed Sep. 15, 2011.

BACKGROUND OF THE INVENTION

1. Field of the Invention

The present invention generally relates to the field of semiconductor power devices, and more particularly, to a super-junction semiconductor power device with various gate arrangements and a fabrication method thereof.

2. Description of the Prior Art

A power device is used in power management; for example, in a switching power supply, a management integrated circuit in the core or peripheral region of a computer, a backlight power supply or in an electric motor control. The types of power devices include insulated gate bipolar transistors (IGBT), metal-oxide-semiconductor field effect transistors (MOSFET), and bipolar junction transistors (BJT), among which the MOSFETs are the most widely applied because of their energy saving properties and their ability to provide faster switching speeds.

In one kind of power MOSFET device, two kind of epitaxial layers, one with a first conductivity type and the other one with a second conductivity type, are disposed alternatively to form several PN junctions inside a body. The junctions are orthogonal to a surface of the body and the device with such PN junctions is also called a super-junction power MOSFET device. In addition, in order to control the on-off state of current transmitting in devices, a plurality of gate structure units is disposed on a cell region of the device. But in a conventional super-junction power device, some drawbacks still need to be overcome. For example, each of the gate structure units usually has non-rounded corner, which may reduce the voltage sustaining ability of the device. In addition, this kind of gate structure unit layout is not good enough to meet the requirement of various products.

In light of the above, there is still a need for providing a structure and a method for fabricating an improved super-junction power MOSFET, which has to be capable of overcoming the shortcomings and deficiencies of the prior art.

SUMMARY OF THE INVENTION

One objective of the invention is therefore to provide super-junction power devices with various layouts of gate structure units and a fabrication method thereof that has a better voltage sustaining ability, compared to conventional power devices so that the power devices can meet the requirement of various kinds of products.

To this end, the invention provides a super junction transistor comprising the following components. A drain substrate having a first conductivity type; an epitaxial layer having a second conductivity type, wherein the epitaxial layer is disposed on the drain substrate; a plurality of gate structure units embedded on the surface of the epitaxial layer; a plurality of trenches disposed in the epitaxial layer between the drain substrate and the gate structure units; a buffer layer in direct contact with the interior surface of the trenches; a plurality of body diffusion regions with a first conductivity type adjacent to the outer surface of the trenches, wherein there is at least a PN junction on the interface between the body diffusion region and the epitaxial layer; and a doped source region, wherein the doped source region is disposed in the epitaxial layer and is adjacent to the gate structure unit.

According to another embodiment, a super junction transistor is provided, which comprises: a drain substrate having a first conductivity type; an epitaxial layer having a second conductivity type, wherein the epitaxial layer is disposed on the drain substrate; a plurality of doped source units having the first conductivity type, wherein the doped source units are embedded on the surface of the epitaxial layer; a gate structure embedded on the surface of the epitaxial layer, wherein the gate structure is adjacent to the doped source units; a plurality of trenches disposed in the epitaxial layer between the drain substrate and the doped source units; a buffer layer in direct contact with the interior surface of the trenches; and a plurality of body diffusion regions with a first conductivity type adjacent to the outer surface of the trenches, wherein there is at least a PN junction on interface between the body diffusion region and the epitaxial layer.

According to another embodiment, a method of fabricating a super junction transistor is provided, which comprises the following steps. A drain substrate having a first conductivity type is provided. An epitaxial layer is formed on the drain substrate, wherein the epitaxial layer has a second conductivity type. A plurality of trenches is formed in the epitaxial layer. A buffer layer is formed and is in direct contact with the interior surface of the trenches. A dopant source layer is filled into the trenches, wherein the dopant source layer has at least dopants with the first conductivity type. An etching process is performed to form a plurality of recessed structures above the respective trenches. A gate oxide layer is formed on the surface of each recessed trench and the dopants inside the dopant source layer are diffused into the epitaxial layer through the buffer layer to thereby form at least a body diffusion layer of the first conductivity type. A gate conductor is filled into the recessed structures to form a plurality of gate structure units. A doped source region having the first conductivity type is formed, wherein the doped source region is disposed in the epitaxial layer and is adjacent to each gate structure unit.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
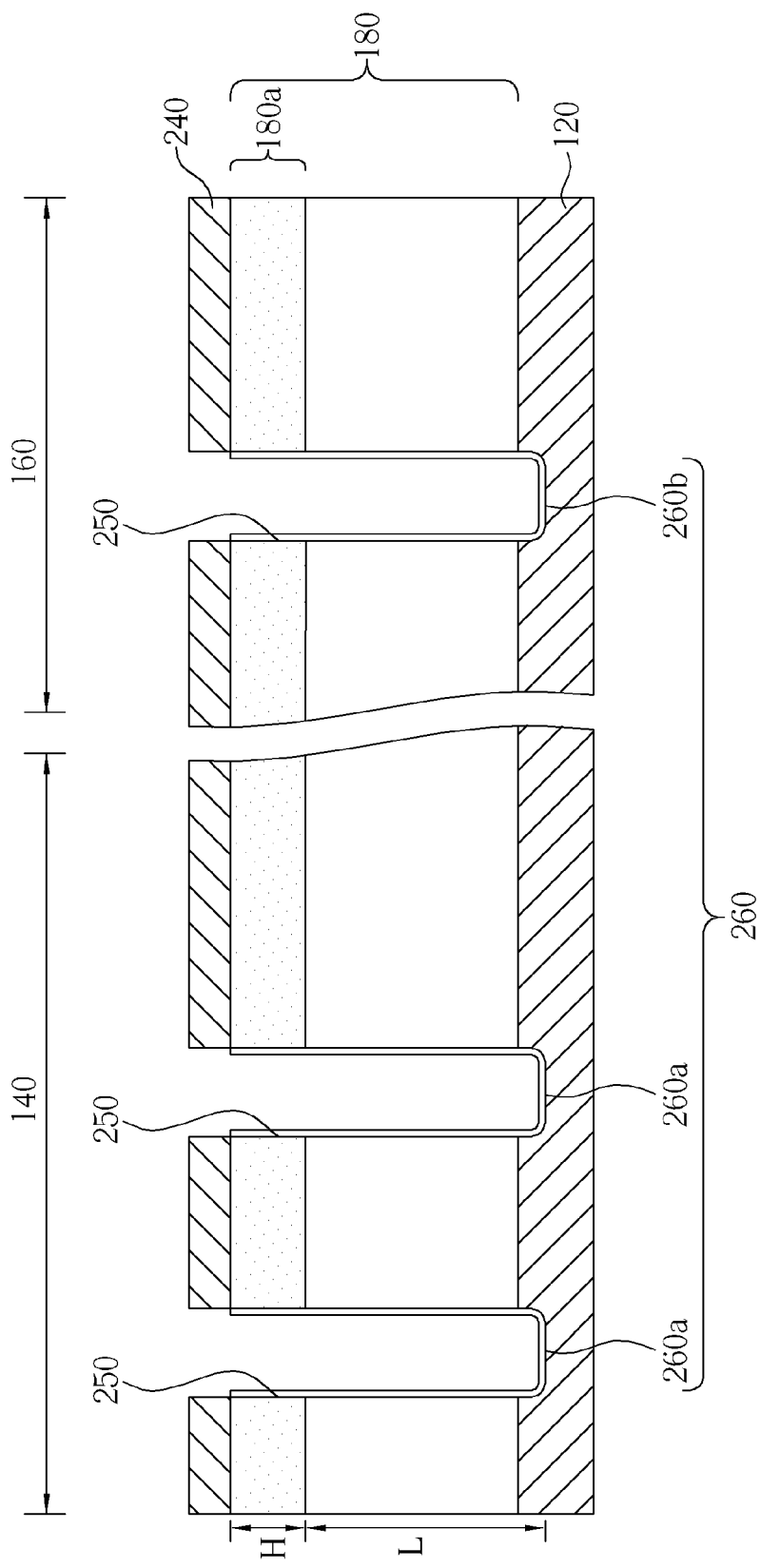
FIGS. 1-8 are schematic diagrams showing a method for fabricating super-junction power devices with various layouts of gate structure units according to one embodiment of the invention.
Figure 2:
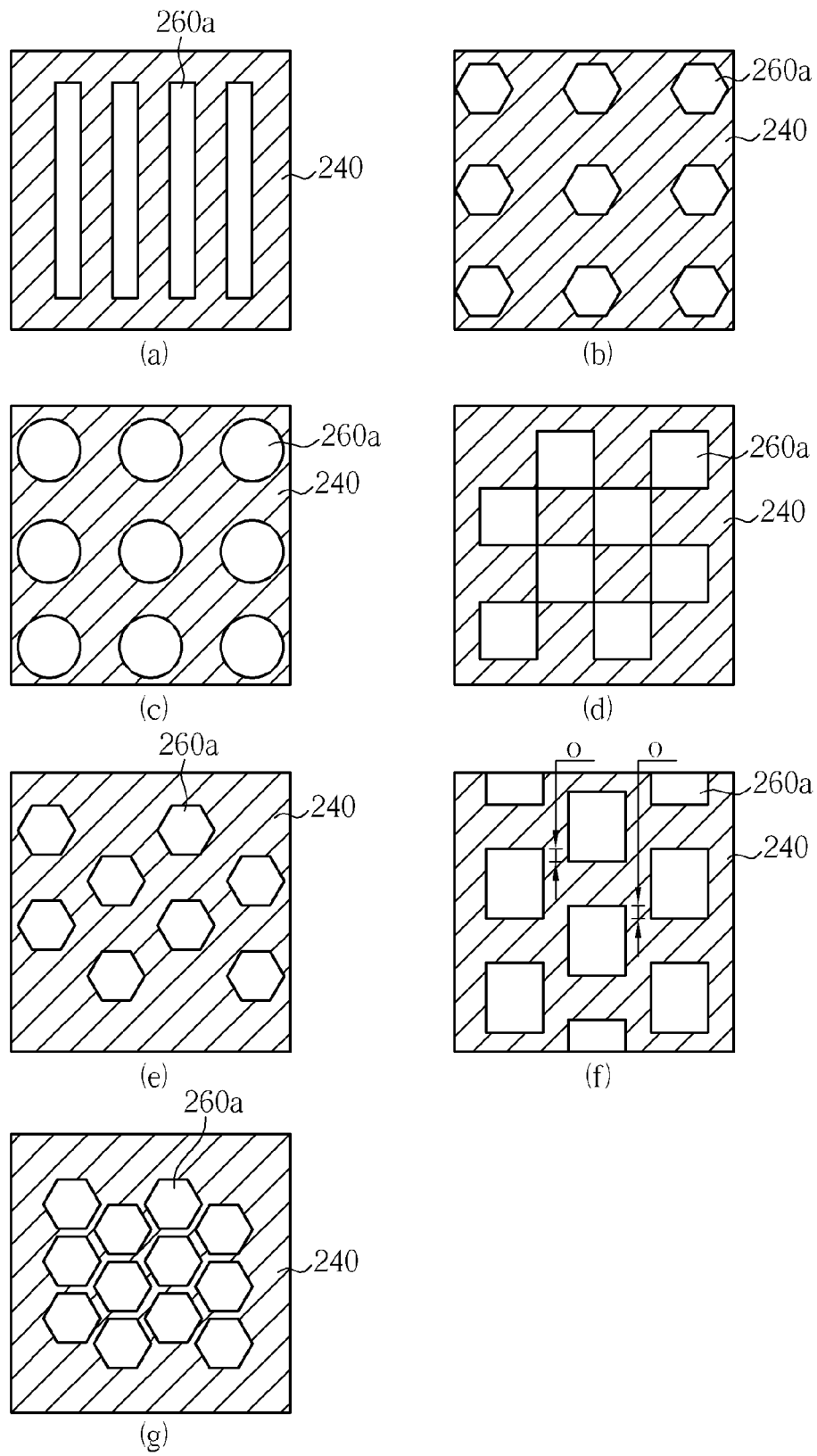

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are semi-diagrammatic and not to scale, and some dimensions are exaggerated in the figures for the sake of clarity. Also, where multiple embodiments are disclosed and described as having some features in common, like or similar features will usually be described with the same reference numerals for ease of illustration and description thereof. Additionally, terms such as "first conductivity type" and "second conductivity type" used in the following paragraph refer relatively to conductive types between different materials; for example, first and second conductivity types may be deemed as n-type and p-type respectively, and vice versa.

FIGS. 1-8 are schematic diagrams showing a method for fabricating a super-junction power device with various layouts of gate structure units according to embodiments of the invention. First, as shown in FIG. 1, a drain substrate 120 with a first conductivity type, such as an N-type conductivity, is provided, wherein two regions, i.e. a cell region 140 and a termination region 160, are respectively defined to accommodate a semiconductor device with a switching ability (such as a MOSFET) and a voltage sustaining structure to prevent the high intensity electric field generated from the cell region 140 from spreading. Then, by performing an epitaxial growth process, an epitaxial layer 180 with a second conductivity, such as P-type conductivity, is grown on the drain substrate 120. Optionally, after the formation of the epitaxial layer 180, at least an ion implantation process may be further carried out on a certain region within the upper portion of the epitaxial layer 180 to form a well 180a with the second conductivity type. The well 180a is preferred to have a higher doping concentration than the epitaxial layer 180. The above-mentioned epitaxial growth process may adopt a physical vapor deposition (PVD), a chemical vapor deposition (CVD) process or any other appropriate deposition methods.

Please still refer to FIG. 1. A plurality of trenches 260 is defined in the epitaxial layer 180 and detailed processes are described as below. First, a hard mask layer 240 is formed on the epitaxial layer 180. The hard mask layer 240 may include silicon nitride ($Si_3N_4$) or silicon oxide ($SiO_2$), but is not limited thereto. Then, a photolithography and an etching process are carried out to etch the trenches 260, including trenches 260a and 260b, into both the hard mask 240 and the epitaxial layer 180 within the respective cell region 140 and the termination region 160. It should be recognized that, according to this embodiment, the bottom of each of the trenches 260 is located in the drain substrate 120, A buffer layer 250 is formed on the interior surface of each of the trenches 260 through a thermal oxidation method or other similar methods, wherein the buffer layer 250 comprises silicon oxide, but not limited thereto. It is worth noting that, according to embodiments of the invention, a lower portion L of the trenches 260 is used to define the location of super-junctions (not shown) while the shape of each upper portion H of the trenches 260 corresponds to the gate structure units (not shown) fabricated in the following processes. That is to say, the shape of each gate structure unit is defined by the upper portion H of the trench 260. In this embodiment, the invention only focuses on the design of the upper portion H of the trench 260a; however, the design can be also applied to the upper portion H of the trench 260b.

FIG. 2(a)-(g) are top-view diagram showing various design layouts of the trenches according to embodiments of the invention. As shown in FIG. 2(a)-(g), the arrangement of the trenches 260a may have the following types: parallel stripe arrangement, matrix arrangement, alternated arrangement or honeycomb arrangement. These arrangements are described in detail as follows. Please refer to FIG. 2(a). In FIG. 2(a) the trenches 260a are parallel to one another. As shown in FIG. 2(b) and (c), the trenches 260a are arranged in a matrix way and the shapes of the trenches 260a are hexagonal and circular respectively, but are not limited thereto; for example, the shape of the trenches 260a may be rectangle or polygon. As shown in FIG. 2(d) and (e), the trenches 260a have an alternated arrangement, where at least one side of each trench 260a is aligned with at least one side of an adjacent trench 260a. In contrast, as shown in FIG. 2(f), at least one side of each trench 260a is overlapped with at least one side of an adjacent trench 260a. That is to say that there are overlapped regions O between the trenches 260a. Finally, please refer to FIG. 2(g), wherein the trenches 260a are arranged in a honeycomb layout.

Figure 3:
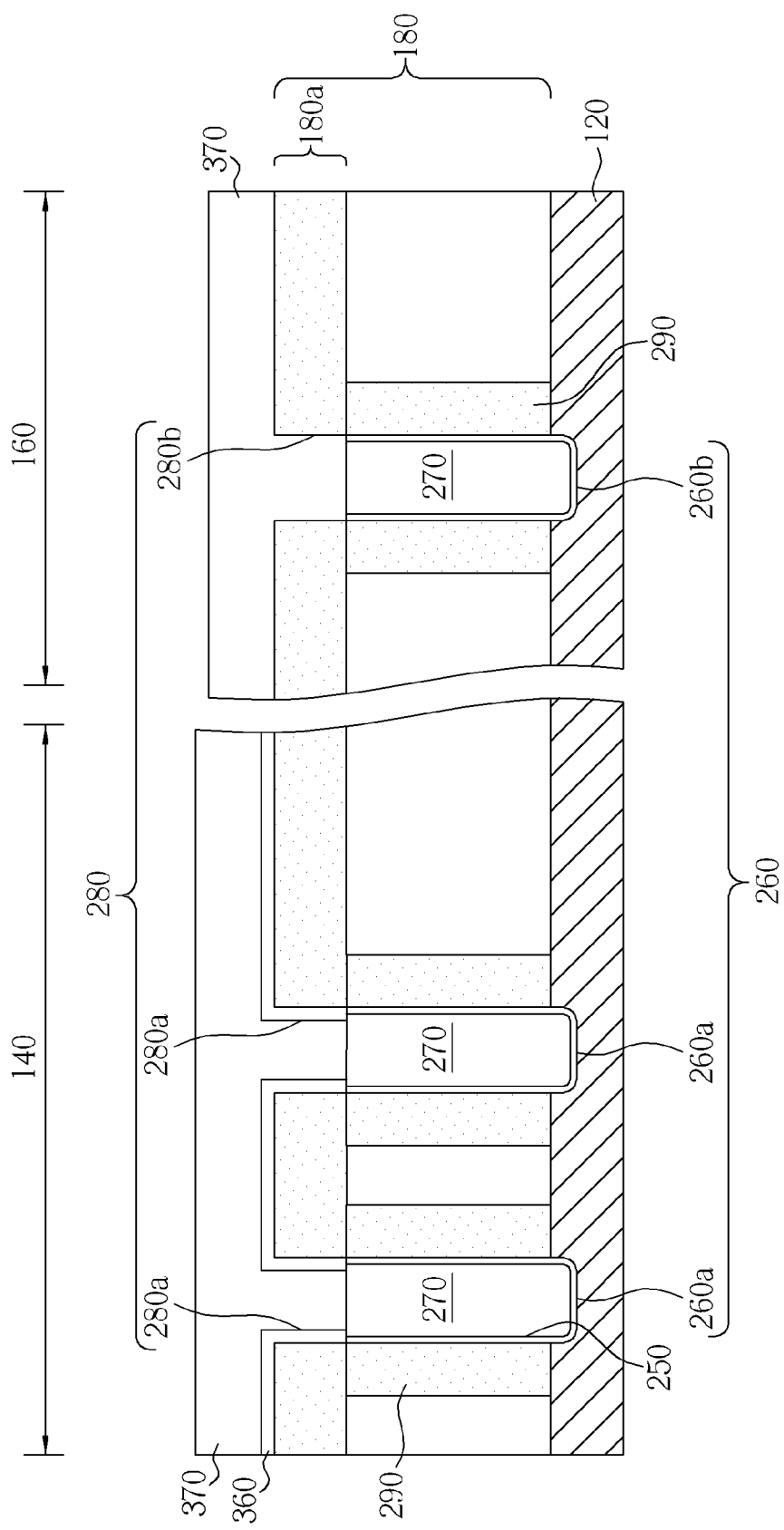

As depicted in FIG. 3, a dopant source layer 270 is disposed on the surface of the epitaxial layer 180 and fills up the trench 260. The composition of the dopant source layer 270 may be arsenic silicate glass (ASG), but is not limited thereto. An etching back process is carried out to completely remove the dopant source layer 270 located directly on the hard mask layer 240 (not shown) and to further form a recessed structure 280, including at least a recessed structure 280a and at least a recessed structure 280b within the cell region 140 and the termination region 160 respectively at the upper part of the trench 260 concurrently. In addition, the depth of each trench 280 is approximately equal to the junction depth of the well 180a. Steps for forming a channel (not shown) around the interior surface of the recessed structure 280a and adjusting the threshold voltage ($V_{th}$) thereof are described in detail as follows. First, a photolithographic process is performed, followed by applying a tilted angle ion implantation to form the channel (not shown), wherein the threshold voltage of the channel may be modulated by a doping degree of the channel. Finally, the hard mask layer 240 is completely removed to expose the surface of the epitaxial layer 180. Still refer to FIG. 3. A gate oxide layer 360 is formed conformally on the inner surface of each recessed structure 280. When the gate oxide layer 360 is formed, dopants inside the dopant source layer 270 can diffuse into the epitaxial layer 180 concurrently; therefore, a body diffusion region 290 with the first conductivity type is formed to surround each of the trenches 260 in the epitaxial layer 180. At this time, at least a PN-junction located on interfaces between the body diffusion regions 290 and the epitaxial layer 180 is formed and is vertical to the surface of the drain substrate. Then, an etching process is carried out to remove the gate oxide layer 360 inside the recessed structure 280b. A gate conductor 370 for controlling the on-off state of the channel (not shown) is formed to cover the surface of the epitaxial layer 180 and fill up the recessed structure 280 within the cell region 140 and the termination region 160, wherein the gate conductor 180 includes polysilicon or other suitable conductive material.

Figure 4:
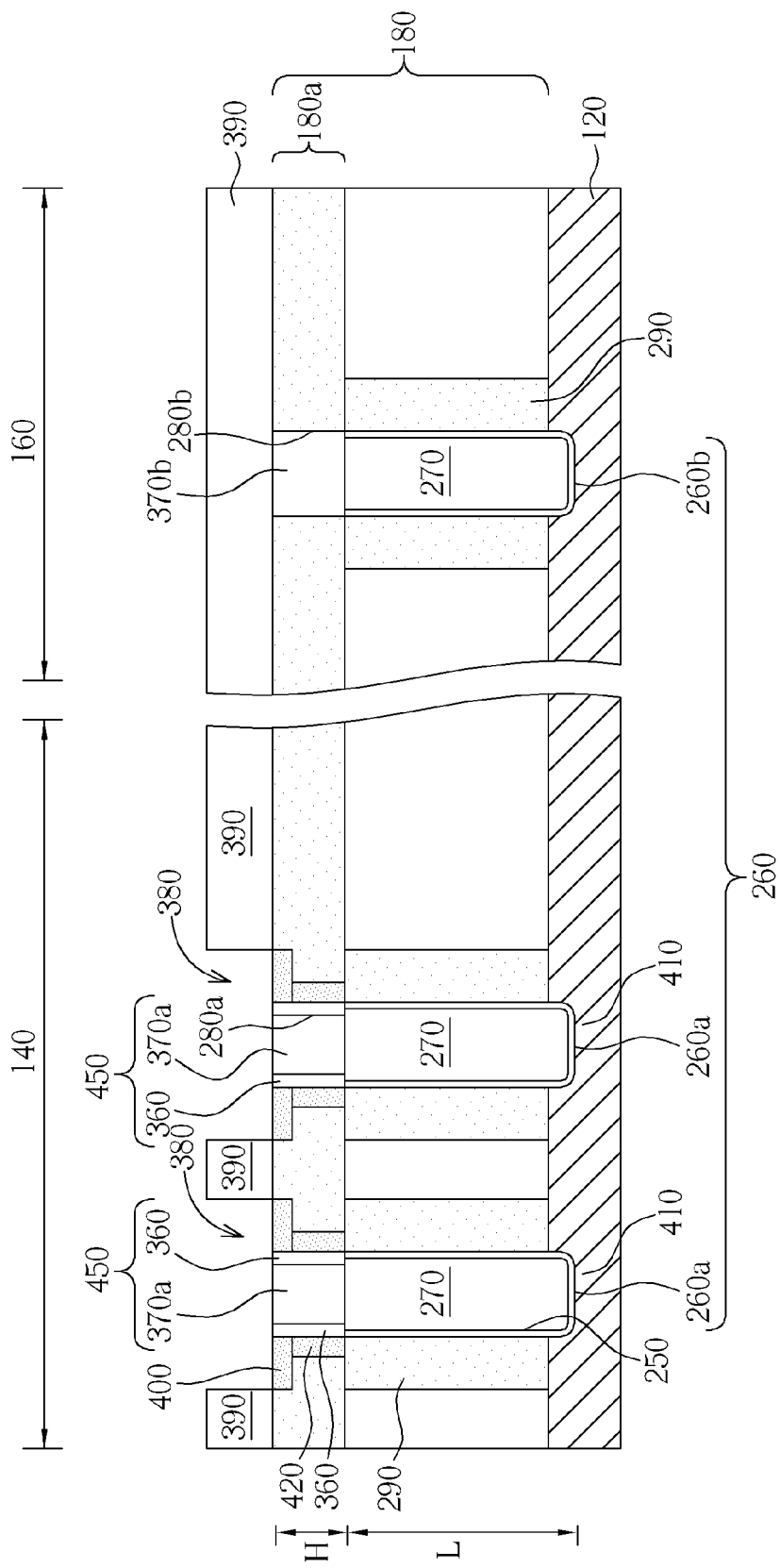

Following the above processes, a chemical mechanical polishing (CMP) process and an etching back process are then performed sequentially, as shown in FIG. 4, so that the gate conductor 370 above the surface of the epitaxial layer 180 can be eliminated completely. It should be noted that the gate conductor 370a inside the recessed structure 280a is in direct contact with the dopant source layer 270 and is surrounded by the gate oxide layer 360. In this case, the gate conductor 370a is electrically isolated from the epitaxial layer 180 or well 180a. In contrast, the gate conductor 370b inside the recessed structure 280b is not surrounded by the gate oxide layer so that the gate conductor 370b is in direct contact with the epitaxial layer 180 or the well 180a. The gate conductor 370b functions as a coupling conductor which avoids the occurrence of an abrupt voltage drop within the termination region 160 and further terminates the voltage in certain area. Then, by applying a photolithographic process, a photoresist pattern 390 is formed to expose an active area 380 within the cell region 140. An ion implantation process is further carried out so that a source heavily doped region 400 with the first conductivity type is formed around the gate conductor 370a in the epitaxial layer 180 or well 180a.

Figure 5:
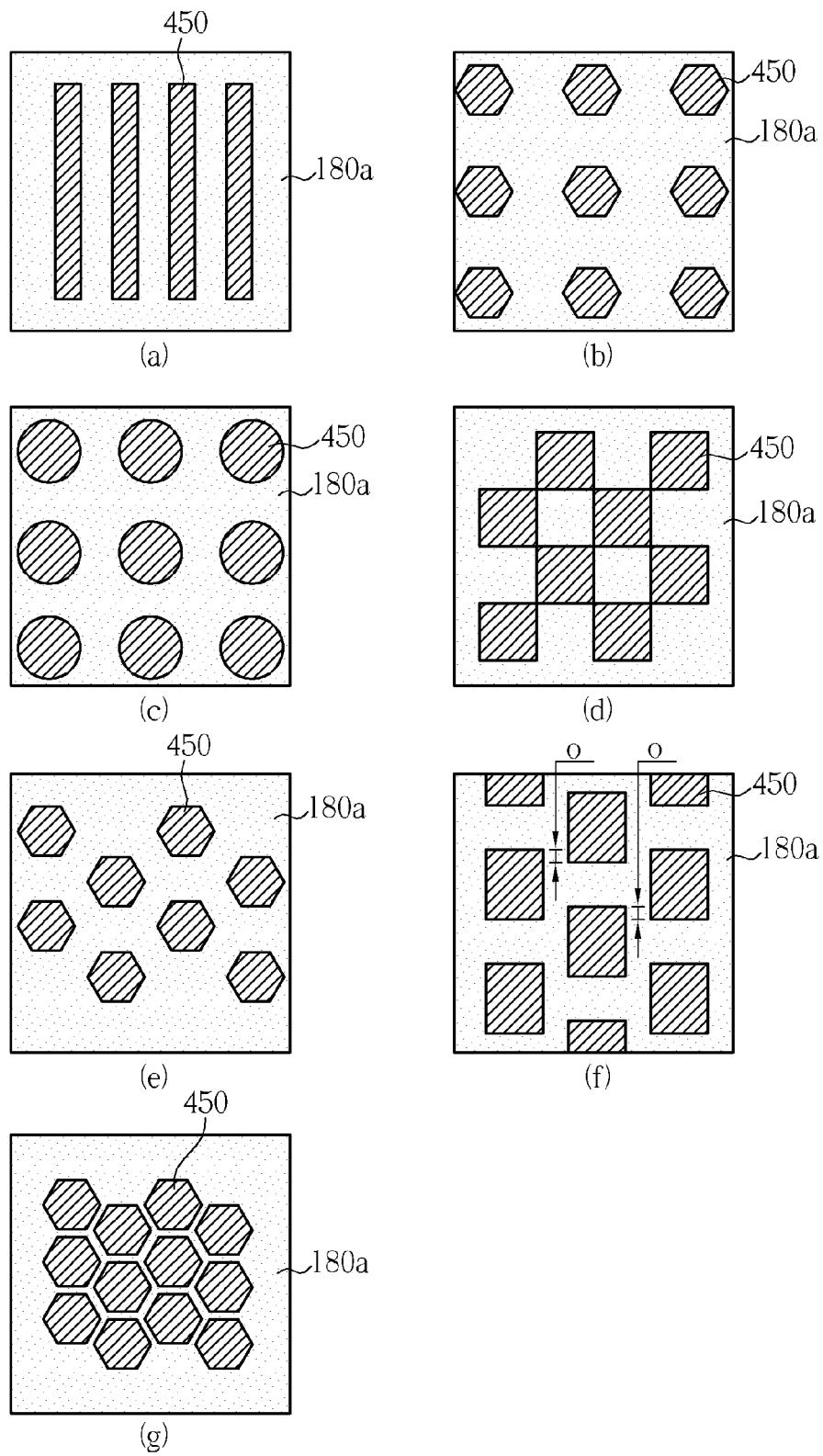

At this point, the structure of the vertical MOSFET 410 is formed, which comprises a gate conductor 370a, a gate oxide 360, an heavily doped source region 400 and a body diffusion region 290, wherein a channel 420 is disposed between the heavy doped source region 400 and the body diffusion region 290 with the first conductivity type. It should be noted that each gate oxide 360 and each gate conductor 370a may comprise a gate structure unit 450. Additionally, the top-view shape of each gate structure unit 450 is the same as the shape defined by the upper portion H of the trench 260, wherein the layout of the gate structure units 450 are shown in FIG. 5 (a)-(g) and the related features may refer to FIG. 2(a)-(g). As shown in FIG. 5 (a)-(g), each of the gate structure unit 450 is directly encompassed by the well 180a and the gate structure units 450 may be arranged in various kinds of layouts; for example, strip layout, matrix layout, alternated layout or honeycomb layout. In one case, at least one side of each gate structure unit 450 is aligned with at least one side of an adjacent gate structure unit 450. In another situation, at least one side of each gate structure unit 450 is overlapped with at least one side of an adjacent gate structure unit 450. That is to say, overlapped regions O are formed between the adjacent gate structure units 450. In addition, a top-view shape of each gate structure unit 450 may comprise circles, squares, hexagons or polygons, but is not limited thereto.

In the preceding paragraph, the top-view shape of each gate structure unit 450 is the same as the shape defined by the upper portion H of the trench 260a, that is to say, the shapes of the gate structure unit 450 and the trench 260a are defined by the same etching processes. According to other embodiments, each gate structure unit 450 and the upper portion H of the trench 260a have different top-view shapes. This means that they can be shaped by different etching processes. Since the difference is obvious and can be understood to those skilled in the art, for the sake of brevity, the detailed description related to fabrication of the gate structure units 450 and the upper portion H with different top-view shapes is therefore omitted.

Figure 6:
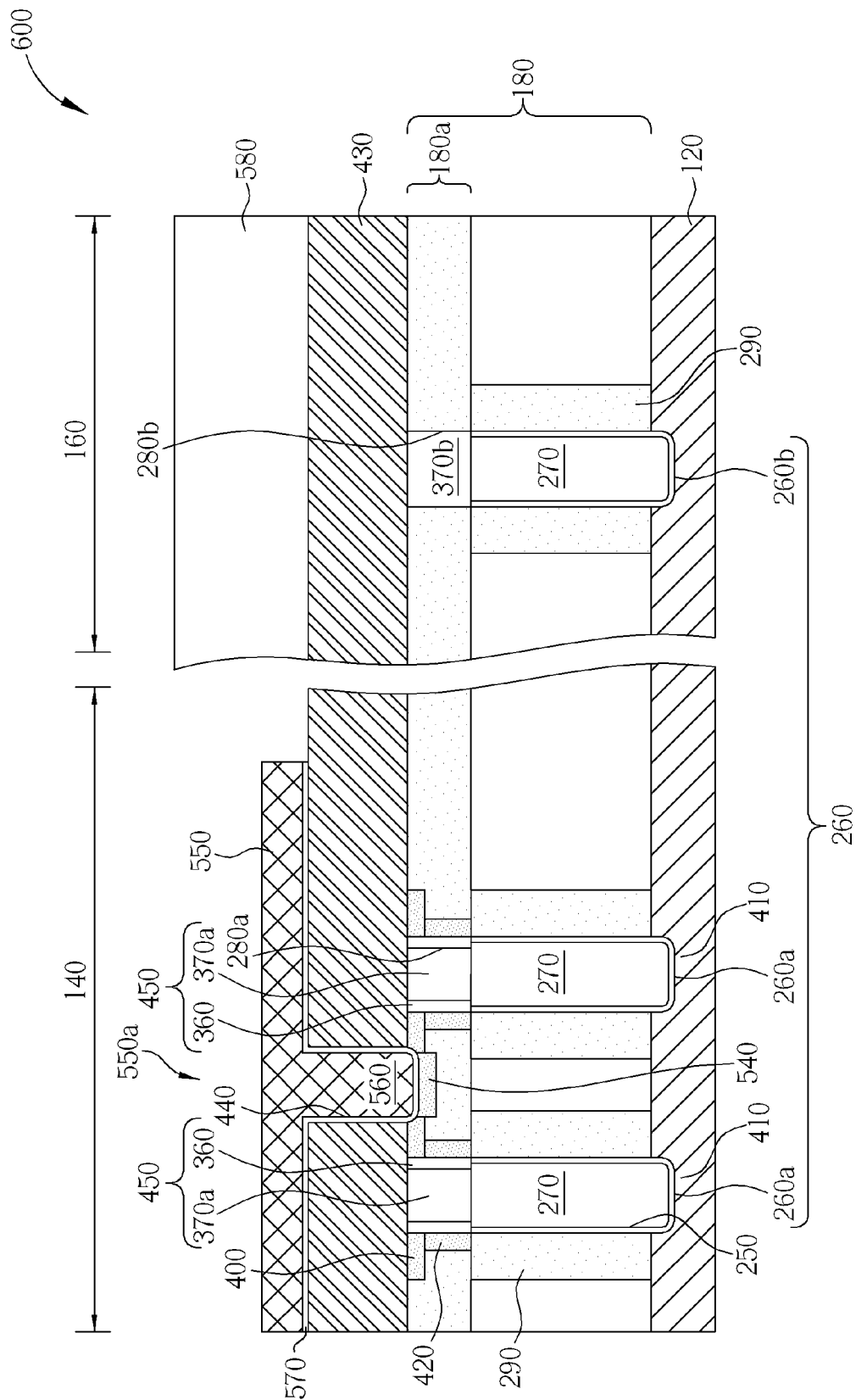

As shown in FIG. 6, after the above-described gate structure units 450 are fabricated, the photoresist pattern 390 (not shown) is eliminated to expose the surface of the epitaxial layer 180. Then, a dielectric layer 430 is formed, which covers the epitaxial layer 180 and the gate conductors 370a and 370b within the cell region 140 and the termination region 160. At least a contact opening 440 is defined in the cell region 140 through a photolithography and an etching process, which expose a part of the epitaxial layer 180 or the well 180a from the contact opening 440. An ion implantation process is performed to form a heavily doped region 540 with the second conductivity type at the bottom of the contact opening 440 followed by an anneal process to activate the dopants in the heavily doped region 540. It should be noted that the purpose of the heavily doped region 540 is to reduce the interfacial resistance between metal and semiconductor to reduce the losses of current flowing through the interface.

Finally, a metal layer 550 is deposited within the cell region 140 and the termination region 160 by a sputter deposition or an electron beam deposition etc. The metal layer 550 fills the contact opening 440 and therefore forms a source conductor 560, wherein the metal layer 550 includes titanium, aluminum, tungsten, titanium nitride or other metal or metal composite thereof. Before the filling of the metal layer 550, a barrier layer 570, such as titanium (Ti), titanium nitride (TiN), tantalum (Ta), tantanum nitride (TaN) or other metal or metal composite thereof, may be formed to prevent metal atoms inside the metal layer 550 from electro-migrating or diffusing into the epitaxial layer 180. Then, another photolithographic process is performed to remove a part of the metal layer 550, thereby forming at least a source pattern 550a. Finally, a protecting layer 580 is formed to cover the termination region 160. As a result, the super-junction power MOSFET 600 is formed.

Figure 7:
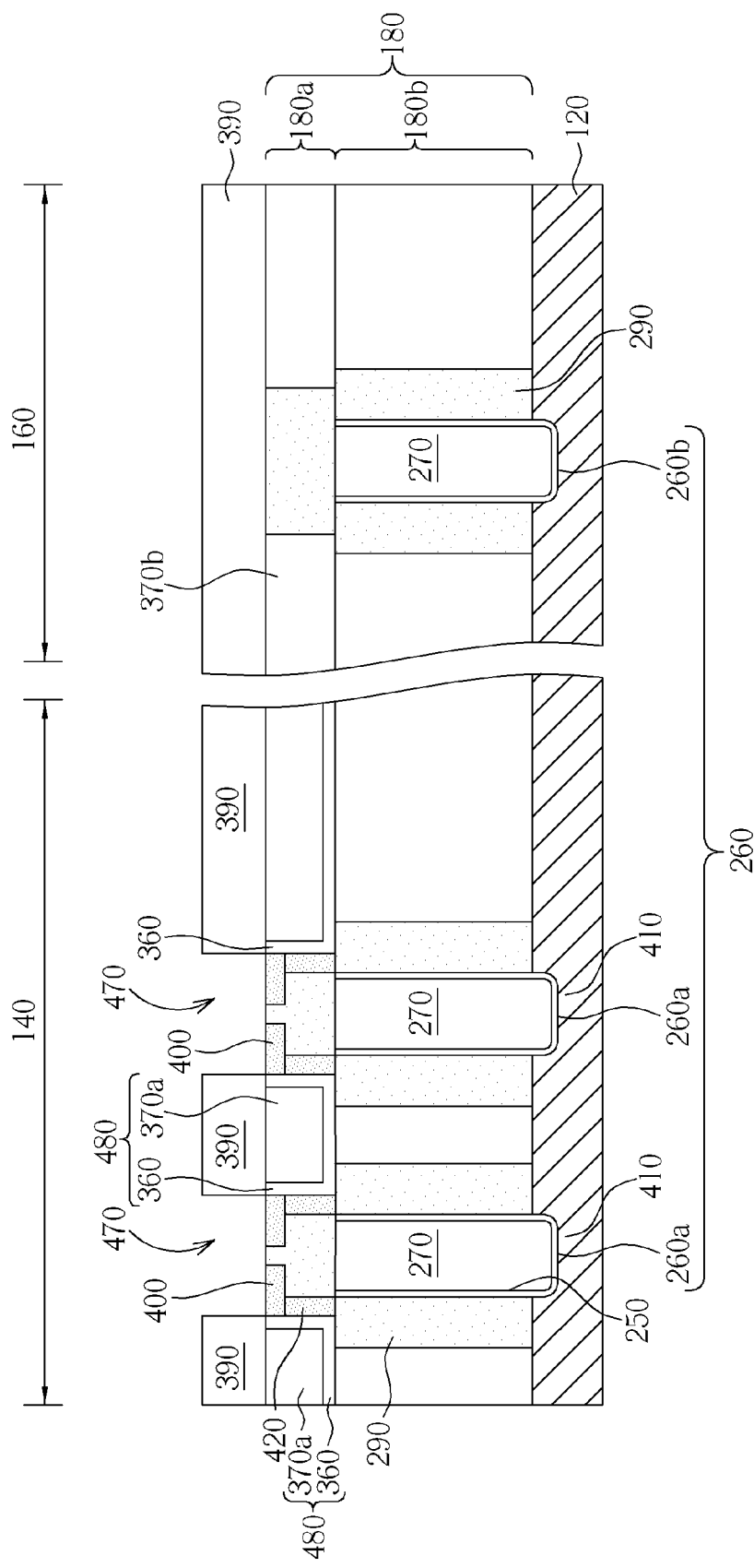
Figure 8:
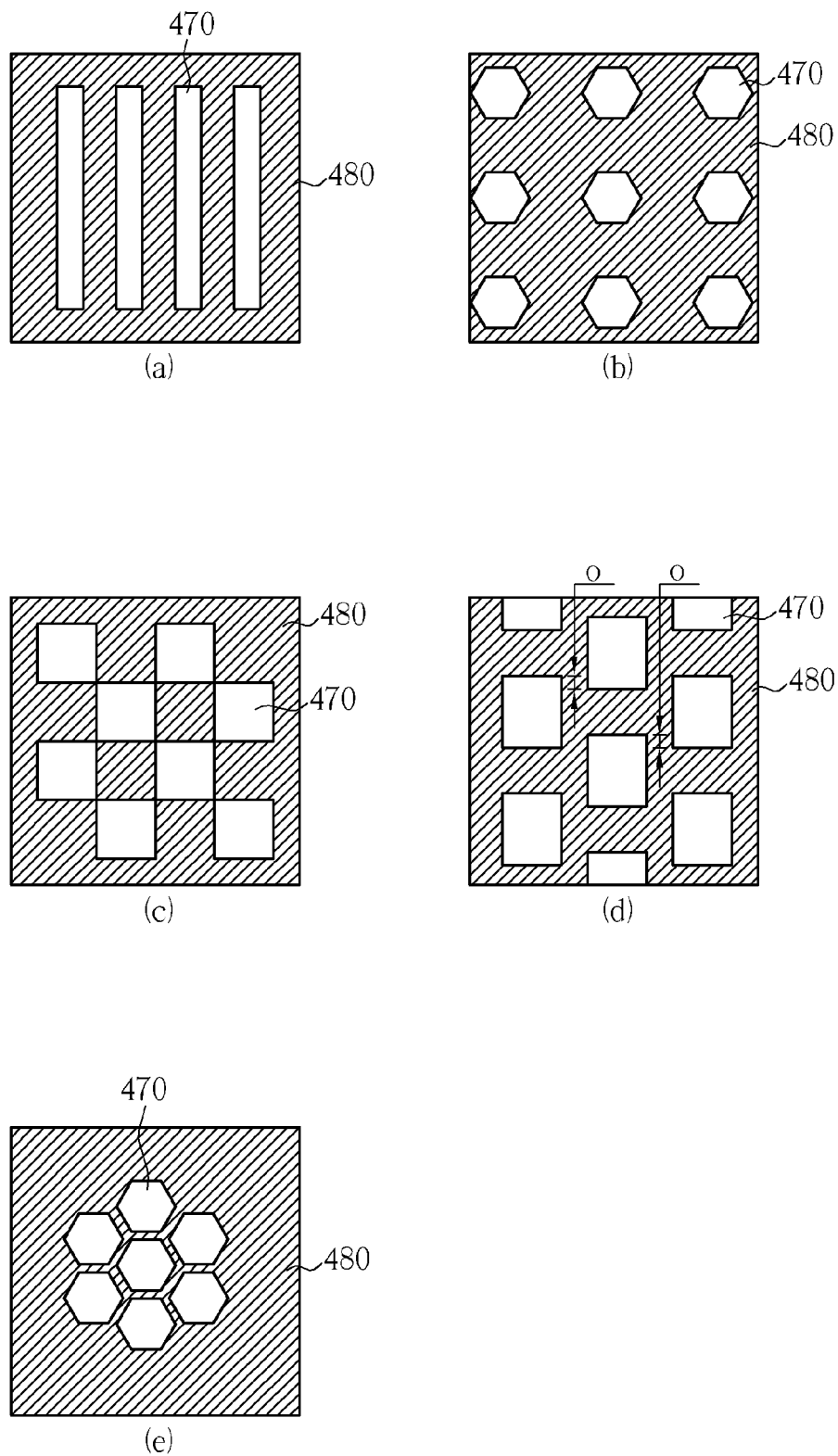

The above-described super-junction power MOSFET 600 comprises the heavily doped source regions 400 and the gate structure units 450. According to another embodiment of the invention, a super-junction power MOSFET 600 may comprise doped source units 470 and gate structures 480. The main difference between these two structures is that the positions of the gate and the source are exchanged. In other words, in this case, source structures are situated above the trenches 260 while gate structures are located above the epitaxial layer 180b. For the sake of clarity, only the main difference is described in the following paragraph. Please refer to FIG. 7. The structure shown in FIG. 7 is similar to the structure shown in FIG. 4, but the gate structures 480 are located right above the epitaxial layer 180b instead of the trenches 260a. In this embodiment, each doped source unit 470 is surrounded by the gate structure 480, which comprises a gate oxide layer 360 and a gate conductor 370a, and the gate oxide layer 360 is conformally in contact with the gate conductor 370a. The top-view layout of the above structure is shown in FIG. 8 (a)-(e) and is similar to the layout shown in FIG. 5 (a)-(g). As shown in FIG. 8 (a)-(e), doped source units 470 may be arranged in various ways, such as stripe layout, matrix layout, alternated layout or honeycomb layout. Please refer to FIG. 8 (a), where doped source regions 470 are parallel to one another. As shown in FIG. 8 (b), the doped source regions 470 are arranged in a matrix layout and the shape of each doped source regions 470 is hexagonal, but is not limited thereto; for example, the shape of each doped source regions 470 may be a polygon. As shown in FIG. 8 (c), the doped source regions 470 have an alternated arrangement, wherein at least one side of each of the doped source regions 470 is aligned with at least one side of an adjacent doped source region 470. In contrast, as shown in FIG. 8 (d), at least one side of each doped source regions 470 is overlapped with at least one side of an adjacent doped source region 470, that is to say, there are overlapped regions O between the doped source regions 470. Finally, please refer to FIG. 8 (e), wherein the doped source regions 470 are arranged in a honeycomb layout.

In summary, the present invention provides one kind of super-junction MOSFET 600 with various arrangements of the gate structure units 450 or the doped source units 470, which can offer a wider device application range. In addition, by adjusting the shape of different units (i.e. the gate structure units 450 or the doped source units 470), the super-junction MOSFET 600 may provide an improved voltage sustaining ability and its reliability can therefore be increased.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A super junction transistor, comprising:
   a drain substrate having a first conductivity type;
   an epitaxial layer having a second conductivity type, wherein the epitaxial layer is disposed on the drain substrate;
   a plurality of gate structure units embedded in surface of the epitaxial layer;
   a plurality of trenches disposed in the epitaxial layer between the drain substrate and the gate structure units;
   a buffer layer in direct contact with the inner surface of the trenches;
   a plurality of body diffusion regions with a first conductivity type adjacent to the outer surface of the trenches, wherein there is at least a PN junction on the interface between the body diffusion region and the epitaxial layer; and
   a doped source region, wherein the doped source region is disposed in the epitaxial layer and is adjacent to the gate structure unit.

2. The super junction transistor according to claim 1, wherein each of the gate structure units comprises a gate conductor and a gate oxide layer.

3. The super junction transistor according to claim 1, wherein the gate structure units are arranged in a parallel stripe layout.

4. The super junction transistor according to claim 1, wherein the gate structure units are arranged in a matrix layout.

5. The super junction transistor according to claim 1, wherein a top-view shape of each gate structure unit comprises circles, squares, hexagons or polygons.

6. The super junction transistor according to claim 5, wherein the gate structure units are arranged alternatively and at least one side of each gate structure unit is aligned with at least one side of adjacent gate structure unit.

7. The super junction transistor according to claim 5, wherein the gate structure units are arranged alternatively and at least one side of each gate structure unit is overlapped with at least one side of an adjacent gate structure unit.

8. The super junction transistor according to claim 1, wherein the gate structure units are arranged in a honeycomb layout.

9. The super junction transistor according to claim 1, wherein a layout of the gate structure units is different from a layout of the body diffusion region.

10. The super junction transistor according to claim 1, wherein a layout of the gate structure units is the same as a layout of the body diffusion region.

11. A super junction transistor, comprising:
    a drain substrate having a first conductivity type;
    an epitaxial layer having a second conductivity type, wherein the epitaxial layer is disposed on the drain substrate;
    a plurality of doped source units having the first conductivity type, wherein the doped source units are embedded on the surface of the epitaxial layer;
    a gate structure embedded on the surface of the epitaxial layer, wherein the gate structure is adjacent to the doped source units;
    a plurality of trenches disposed in the epitaxial layer between the drain substrate and the doped source units;
    a buffer layer in direct contact with the inner surface of the trenches; and
    a plurality of body diffusion regions with a first conductivity type adjacent to the outer surface of the trenches, wherein there is at least a PN junction on the interface between the body diffusion region and the epitaxial layer.

12. The super junction transistor according to claim 11, wherein each of the gate structure units comprises a gate conductor and a gate oxide layer.

13. The super junction transistor according to claim 11, wherein the doped source units are arranged in a stripe layout and side of doped source units are laid parallel to each other.

14. The super junction transistor according to claim 11, wherein the doped source units are arranged in a matrix layout.

15. The super junction transistor according to claim 11, wherein the top-view shape of each doped source unit comprises circles, squares, hexagons or polygons.

16. The super junction transistor according to claim 15, wherein the doped source units are arranged alternatively and at least one side of each doped source unit is aligned with at least one side of an adjacent doped source unit.

17. The super junction transistor according to claim 15, wherein the doped source units are arranged alternatively and at least one side of each doped source unit is overlapped with at least one side of an adjacent gate structure unit.

18. The super junction transistor according to claim 11, wherein the doped source units are arranged in a honeycomb layout.

* * * * *